United States Patent
Ye

(10) Patent No.: US 11,552,105 B2
(45) Date of Patent: Jan. 10, 2023

(54) PIXEL STRUCTURE, ARRAY SUBSTRATE, AND DISPLAY DEVICE

(71) Applicant: Shenzhen China Star Optoelectronics Technology Co., Ltd., Shenzhen (CN)

(72) Inventor: Chengliang Ye, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 1026 days.

(21) Appl. No.: 16/319,464

(22) PCT Filed: Dec. 13, 2018

(86) PCT No.: PCT/CN2018/120985
§ 371 (c)(1),
(2) Date: Jan. 21, 2019

(87) PCT Pub. No.: WO2020/082542
PCT Pub. Date: Apr. 30, 2020

(65) Prior Publication Data
US 2021/0358953 A1    Nov. 18, 2021

(30) Foreign Application Priority Data

Oct. 22, 2018    (CN) .......................... 201811232570.8

(51) Int. Cl.
*H01L 27/12* (2006.01)
*G02F 1/1362* (2006.01)
*G02F 1/1368* (2006.01)
*H01L 29/786* (2006.01)

(52) U.S. Cl.
CPC .......... *H01L 27/124* (2013.01); *G02F 1/1368* (2013.01); *G02F 1/136209* (2013.01); *G02F 1/136286* (2013.01); *H01L 29/78633* (2013.01)

(58) Field of Classification Search
CPC ............. H01L 27/124; H01L 29/78633; G02F 1/136209; G02F 1/136286; G02F 1/1368
See application file for complete search history.

(56) References Cited

U.S. PATENT DOCUMENTS

| | | | |
|---|---|---|---|
| 2003/0137615 A1 | 7/2003 | Nakayoshi et al. | |
| 2011/0090446 A1 | 4/2011 | Kim et al. | |

FOREIGN PATENT DOCUMENTS

| | | |
|---|---|---|
| CN | 103293797 A | 9/2013 |
| CN | 107121864 A | 9/2017 |
| CN | 107479271 A | 12/2017 |
| CN | 107490912 A | 12/2017 |
| CN | 107958910 A | 4/2018 |

*Primary Examiner* — Robert G Bachner
(74) *Attorney, Agent, or Firm* — PV IP PC; Wei Te Chung; Ude Lu

(57) ABSTRACT

The invention provides a pixel structure, an array substrate, and a display device. The pixel structure includes: scanning lines and data lines; at least one pixel electrode configured in each of pixel areas; at least one shading electrode line connecting to a common voltage, the shading electrode line being configured to be above the data line to shade the data line; a first TFT being configured between the scanning line and the pixel electrode, and the first TFT connecting to the pixel electrode; at least one shading electrode connection line extending along a direction of the scanning line, and the shading electrode connection line electrically connecting to two adjacent shading electrode lines; and the shading electrode connection line being wound to form a mesh pattern, and a semiconductor layer of the first TFT is configured to be opposite to a hollow area of the mesh pattern.

20 Claims, 4 Drawing Sheets

PIXEL STRUCTURE, ARRAY SUBSTRATE, AND DISPLAY DEVICE

BACKGROUND OF THE INVENTION

1. Field of the Invention

The present invention relates to the field of display technology and, in particular, to the field of a pixel structure, an array substrate, and a display device.

2. The Related Arts

Currently, 3T, i.e., thin film transistors, technology is the main solution to enhance the wide viewing angle performance of LCD panels, which mainly relates to releasing the voltage of the sub-pixel to the common electrode so as to realize the 8-domain display. FIG. 1 is an equivalent circuit diagram of one conventional 3T pixel structure, and each of the sub-pixels includes a main area (Main) and a sub-area (Sub). The sub-pixel includes a Main transistor (T1), a Sub storage capacitor ($C_A$), a Sub transistor (T2), a Sub storage capacitor ($C_B$), and a shared transistor (T3). A scanning line (Scan) is configured to correspond to a row of sub-pixels, and a data line (Data) is configured to correspond to a column of sub-pixels. As shown in FIG. 1, the rotation angle corresponding to the liquid crystal molecules within the four domains of the Main of one sub-pixel is different from the rotation angle corresponding to the liquid crystal molecules within the four domains of the Sub of one sub-pixel, i.e., the PSVA pixel configured with the 8 domains and 3 three transistors.

Conventionally, for the purpose of curved surface display, the black matrix (BM) design is removed along the data-line-direction, and the indium tin oxide (ITO) shading electrode line is configured to cover the data line. The ITO shading electrode line is connected to the common voltage, such that it operates as the BM. To enhance the uniformity of the potential of the shading electrode line, the shading electrode line above the data line is usually connected to the left and right through the ITO shading electrode connection line in the middle of the pixel to realize the mesh line, such that the resistance of the shading electrode line is reduced.

FIG. 2 is a cross-section view of the ITO shading electrode connection line of one conventional T3. FIG. 3 is a top view of the ITO shading electrode connection line of one conventional T3. As shown in FIGS. 2 and 3, T3 includes a gate 1, a source/drain 2 and a semiconductor layer 40. Due to the limited space, the shading electrode connection line 30 passes through the semiconductor layer 40 of the T3 right via the T3 so as to increase the aperture rate. The potential of the shading electrode connection line 30 is the same with the potential of the shading electrode connection line connecting to the common voltage. Generally, the common voltage is about 6V. Although there is a color resistance 50, the shading electrode connection line 30 is far away from the T3 configured below. Nevertheless, due to the gate, the off-state current of the T3 may still be affected. During a display state, even if the gate of the lower T3 is already in an off state, the T3 is not completely turned off due to the common voltage on the shading electrode connection line 30 of the upper surface, which may affect the display performance.

SUMMARY OF THE INVENTION

The present disclosure relates to a pixel structure, an array substrate, and a display device to prevent the TFT from being affected when the shading electrode connection line passes over the TFT.

In one aspect, a pixel structure includes: scanning lines and data lines; at least one pixel electrode configured in each of pixel areas being defined by the scanning lines and the data lines; at least one shading electrode line connecting to a common voltage, the shading electrode line being configured to be above the data line to shade the data line; a first thin film transistor (TFT) being configured between the scanning line and the pixel electrode, and the first TFT connecting to the pixel electrode; at least one shading electrode connection line extending along a direction of the scanning line, and the shading electrode connection line electrically connecting to two adjacent shading electrode lines; and wherein the shading electrode connection line being wound to form a mesh pattern, and a semiconductor layer of the first TFT is configured to be opposite to a hollow area of the mesh pattern.

Wherein the shading electrode connection line at least partially overlaps with the semiconductor layer.

Wherein the shading electrode connection line also includes a straight portion connecting to the mesh pattern via a connecting point, and the connecting point is not overlapped with the semiconductor layer.

Wherein the pixel structure further includes a second TFT, and the shading electrode connection line further includes a polyline pattern, the shading electrode connection line bypasses a semiconductor layer of the second TFT via the polyline pattern.

Wherein the pixel structure further includes a third TFT, and the shading electrode connection line bypasses a semiconductor layer of the third TFT via the polyline pattern.

Wherein the first TFT is a shared TFT, the second TFT is configured as a main-area TFT, and the third TFT is configured as a sub-area TFT.

Wherein the shading electrode line and the shading electrode connection line are made by indium tin oxide (ITO).

Wherein the polyline pattern includes a right angle.

In one aspect, an array substrate includes the above pixel structure.

In another aspect, a display device includes the above pixel structure.

In view of the above, the pixel structure, the array substrate, and the display device incorporates a mesh pattern to the shading electrode connection line so as to avoid the semiconductor of TFTs. Thus, the impact toward the off-state of the TFTs may be reduced, thereby enhancing the display performance and increasing the pixel aperture ratio.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

Figure 4:
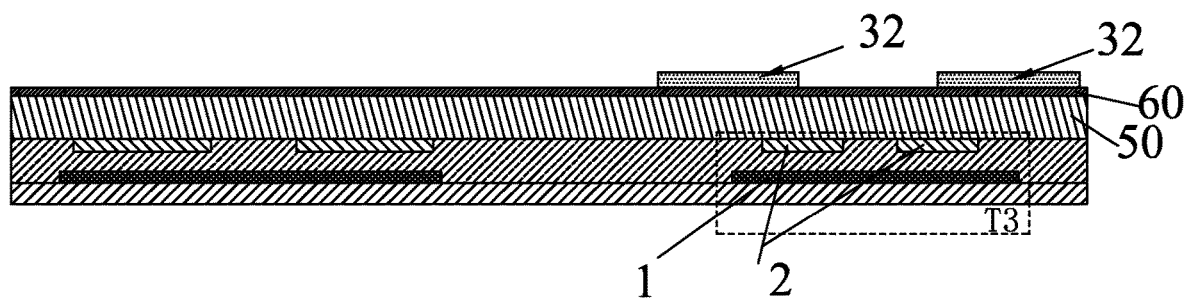
FIG. 4 is a cross-section of the shading electrode connection line of the T1 in accordance with one embodiment of the present disclosure.
Figure 5:
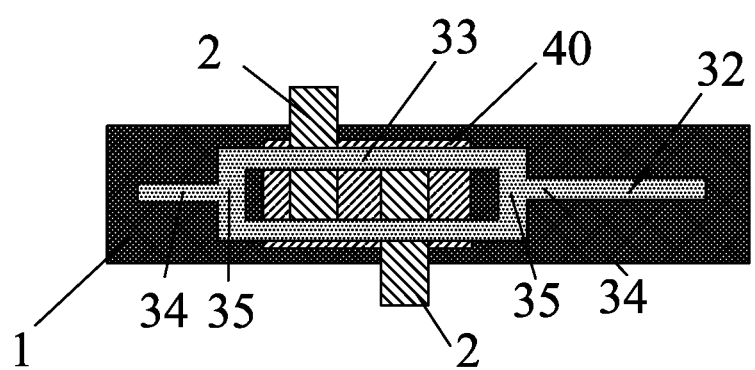
FIG. 5 is a top view of the shading electrode connection line of the T1 in accordance with one embodiment of the present disclosure.

FIG. 4 is a cross-section of the shading electrode connection line of the T1 in accordance with one embodiment of the present disclosure. FIG. 5 is a top view of the shading electrode connection line of the T1 in accordance with one embodiment of the present disclosure.

Figure 1:
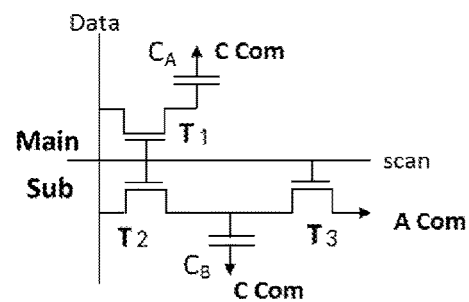
FIG. 1 is an equivalent circuit diagram of one conventional 3T pixel structure.
Figure 2:
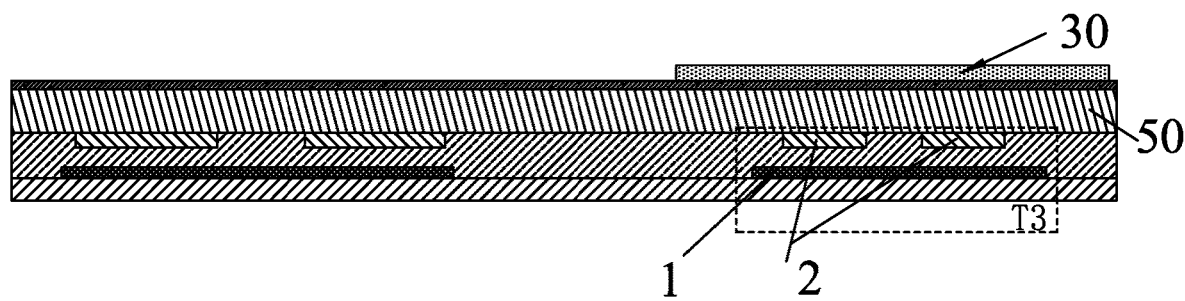
FIG. 2 is a cross-section view of the ITO shading electrode connection line of one conventional T3.
Figure 3:
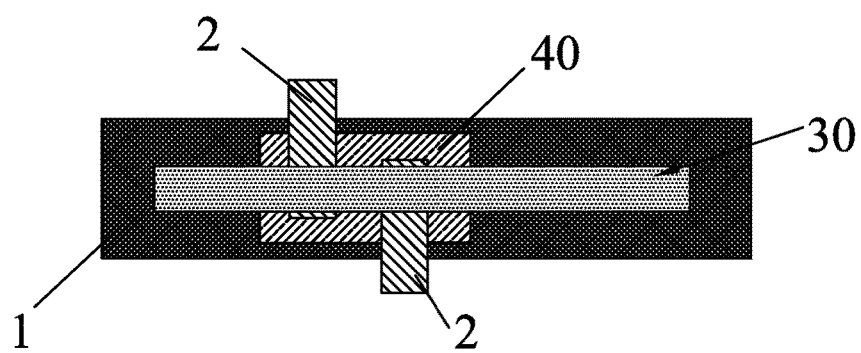
FIG. 3 is a top view of the ITO shading electrode connection line of one conventional T3.

In one embodiment, the shading electrode connection line 32 is wound to form a mesh pattern 33. A semiconductor layer 40 of a first TFT is configured to be opposite to a hollow area of the mesh pattern 33. In an example, the first TFT may be the T3 in FIG. 1, which includes a gate 1, a source/drain 2, and the semiconductor layer 40. The pixel structure further includes a color resistance 50 and a protection layer 60. Due to the limited space, the shading electrode connection line 32 partially overlaps with the semiconductor layer 40. To reduce the impact toward the off-state of the first TFT, the shading electrode connection line 32 is configured to avoid the semiconductor layer 40 as much as possible. The shading electrode connection line 32 further includes a straight portion 34 connecting to the mesh pattern 33 via a connecting point 35, wherein the connecting point 35 is not overlapped with the semiconductor layer 40.

Figure 6:
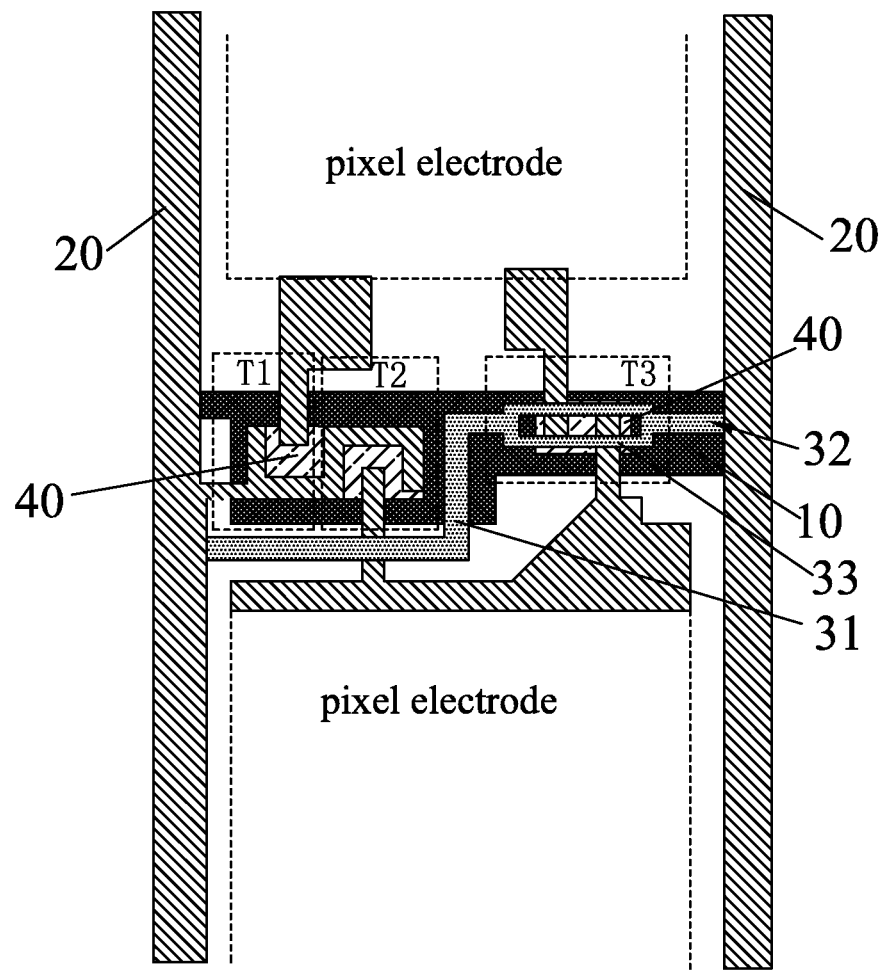
FIG. 6 is a top view of the pixel structure in accordance with one embodiment of the present disclosure.

FIG. 6 is a top view of the pixel structure in accordance with one embodiment of the present disclosure. The pixel structure will be explained in detail by referring to FIGS. 4-6. In an example, the pixel structure is of a 3T eight-domain being configured in a pixel area defined by at least one horizontal scanning line 10 and at least one vertical data line 20. The shading electrode line (not shown) is configured to be above the data line 20 to shade the data line 20. During operation, the shading electrode line connects to the common voltage so as to operate as the BM. At least one TFT is configured between the scanning line 10 and the pixel electrode, and wherein the pixel electrode is controlled by the TFT. In one embodiment, the pixel structure includes a first TFT (a shared TFT, T3), a second TFT (the T1 in the Main), and a third TFT (the T2 in the Sub). The gate of each of the TFTs and the scanning line 10 are configured on the same layer, and the source/drain are configured on the same layer with the data line 20. The gate of each of the TFTs connects to the scanning line 10 to receive scanning signals, the source of each of the TFTs connects to the data line 20 to receive data signals, and the drain connects to the pixel electrode. Each of the TFTs corresponds to the semiconductor layer 40. In one embodiment, the three TFTs of the pixel structure are configured according to the 3T eight-domain design. The three TFTs respectively connects to the pixel electrodes arranged within the Main and the Sub. The pixel electrodes in the Main and the Sub respectively corresponds to four domains. In addition, the pixel structure may include the color resistance 50 and the protection layer 60.

In an example, the shading electrode connection line 32 extends along a direction of the scanning line 10 so as to electrically connect two adjacent shading electrode lines. The shading electrode connection line 32 may be designed to pass directly above or obliquely above the semiconductor layer 40 of each TFTs. In this embodiment, the shading electrode connection line 32 is configured to be obliquely above the second TFT and the third TFT, i.e., the T1 in the Main and the T2 in the Sub, and is configured to be right above the first TFT, i.e., the shared TFT (T3). The shading electrode connection line 32 and the shading electrode line may be indium tin oxide (ITO) traces, and may be configured on the same layer.

With respect to the semiconductor layer 40 of each TFTs, the shading electrode connection line 32 is provided with a patterned structure such that the shading electrode connection line 32 may avoid the semiconductor layer 40 via the patterned structure when extending toward the top of the TFT. The shading electrode connection line 32 is wound to form at least the mesh pattern 33, and the semiconductor layer 40 of the first TFT is disposed opposite to the hollow area of the mesh pattern 33.

The shading electrode connection line 32 can avoid the semiconductor layer 40 of the first TFT via the mesh pattern 33, and may increase the aperture ratio of the pixel. The shading electrode connection line 32 further includes a polyline pattern 31. The shading electrode connection line 32 bypasses the second TFT, that is, the semiconductor layer 40 of the T1 in the Main. The shading electrode connection line 32 bypasses the third TFT, that is, the semiconductor layer 40 of the T2 in the Sub.

In the embodiment, with respect to the semiconductor layer 40 of the shared TFT, the patterned structure of the shading electrode connection line 32 incudes, but not limited to, a rectangular mesh pattern 33. The mesh pattern 33 is configured right above the shared T3 such that the shading electrode connection line 32 passes though the top of the shared T3 in segments. The shading electrode connection line 32 is prevented from being contacted with the semiconductor layer 40 via the hollow area of the mesh pattern 33. In this way, the impact toward the semiconductor layer 40 of the T3 is reduced, and the aperture ratio is increased at the same time. With respect to the T1 in the Main and the T2 in the sub, the shading electrode connection line 32 obliquely passes through the top of the T1 and the T2 via the polyline pattern 31 having a right angle. It can be understood that additional mesh pattern may be configured above the T1 in the Main and the T2 in the Sub.

It can be understood that the number of the TFTs and the location of the TFTs of the pixel structure may also be configured. In an example, the pixel structure only includes a first TFT, and the shading electrode connection line 32 includes the mesh pattern right above the first TFT. With such configuration, the shading electrode connection line 32 extends above the top of the first TFT without contacting the semiconductor layer of the first TFT. Further, the pixel structure includes the second TFT. The shading electrode connection line includes the polyline pattern being arranged obliquely above the second TFT. The shading electrode connection line bypasses the semiconductor layer of the second TFT via the polyline pattern.

The present disclosure also includes an array substrate and a display device including the above pixel structure.

By configuring the shading electrode connection line to avoid the semiconductor layer of the TFT, the interference toward the TFT may be reduced. Not only the display performance may be enhanced, but also the aperture ratio may be increased.

In view of the above, as the shading electrode connection line is designed to avoid the semiconductor, the impact toward the off-state of the TFT is reduced so as to enhance the display performance and the aperture ratio.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A pixel structure, comprising:
   scanning lines and data lines;
   at least one pixel electrode configured in each of pixel areas being defined by the scanning lines and the data lines;
   at least one shading electrode line connecting to a common voltage, the shading electrode line being configured to be above the data line to shade the data line;
   a first thin film transistor (TFT) being configured between the scanning line and the pixel electrode, and the first TFT connecting to the pixel electrode;
   at least one shading electrode connection line extending along a direction of the scanning line, and the shading electrode connection line electrically connecting to two adjacent shading electrode lines; and
   wherein the shading electrode connection line being wound to form a mesh pattern, and a semiconductor layer of the first TFT is configured to be opposite to a hollow area of the mesh pattern.

2. The pixel structure as claimed in claim 1, wherein the shading electrode connection line at least partially overlaps with the semiconductor layer.

3. The pixel structure as claimed in claim 1, wherein the shading electrode connection line also comprises a straight portion connecting to the mesh pattern via a connecting point, and the connecting point is not overlapped with the semiconductor layer.

4. The pixel structure as claimed in claim 1, wherein the pixel structure further comprises a second TFT, and the shading electrode connection line further comprises a polyline pattern, the shading electrode connection line bypasses a semiconductor layer of the second TFT via the polyline pattern.

5. The pixel structure as claimed in claim 4, wherein the pixel structure further comprises a third TFT, and the shading electrode connection line bypasses a semiconductor layer of the third TFT via the polyline pattern.

6. The pixel structure as claimed in claim 5, wherein the first TFT is a shared TFT, the second TFT is configured as a main-area TFT, and the third TFT is configured as a sub-area TFT.

7. The pixel structure as claimed in claim 1, wherein the shading electrode line and the shading electrode connection line are made by indium tin oxide (ITO).

8. The pixel structure as claimed in claim 4, wherein the polyline pattern comprises a right angle.

9. An array substrate having a pixel structure, the pixel electrode comprising:
   scanning lines and data lines;
   at least one pixel electrode configured in each of pixel areas being defined by the scanning lines and the data lines;
   at least one shading electrode line connecting to a common voltage, the shading electrode line being configured to be above the data line to shade the data line;
   a first thin film transistor (TFT) being configured between the scanning line and the pixel electrode, and the first TFT connecting to the pixel electrode;
   at least one shading electrode connection line extending along a direction of the scanning line, and the shading electrode connection line electrically connecting to two adjacent shading electrode lines; and
   wherein the shading electrode connection line being wound to form a mesh pattern, and a semiconductor layer of the first TFT is configured to be opposite to a hollow area of the mesh pattern.

10. The array substrate as claimed in claim 9, wherein the shading electrode connection line at least partially overlaps with the semiconductor layer.

11. The array substrate as claimed in claim 9, wherein the shading electrode connection line also comprises a straight portion connecting to the mesh pattern via a connecting point, and the connecting point is not overlapped with the semiconductor layer.

12. The array substrate as claimed in claim 9, wherein the pixel structure further comprises a second TFT, and the shading electrode connection line further comprises a polyline pattern, the shading electrode connection line bypasses a semiconductor layer of the second TFT via the polyline pattern.

13. The array substrate as claimed in claim 12, wherein the pixel structure further comprises a third TFT, and the shading electrode connection line bypasses a semiconductor layer of the third TFT via the polyline pattern.

14. The array substrate as claimed in claim 13, wherein the first TFT is a shared TFT, the second TFT is configured as a main-area TFT, and the third TFT is configured as a sub-area TFT.

15. The array substrate as claimed in claim 9, wherein the shading electrode line and the shading electrode connection line are made by indium tin oxide (ITO).

16. The array substrate as claimed in claim 12, wherein the polyline pattern comprises a right angle.

17. A display device having a pixel structure, the pixel structure comprising:
   scanning lines and data lines;
   at least one pixel electrode configured in each of pixel areas being defined by the scanning lines and the data lines;
   at least one shading electrode line connecting to a common voltage, the shading electrode line being configured to be above the data line to shade the data line;
   a first thin film transistor (TFT) being configured between the scanning line and the pixel electrode, and the first TFT connecting to the pixel electrode;
   at least one shading electrode connection line extending along a direction of the scanning line, and the shading electrode connection line electrically connecting to two adjacent shading electrode lines; and
   wherein the shading electrode connection line being wound to form a mesh pattern, and a semiconductor layer of the first TFT is configured to be opposite to a hollow area of the mesh pattern.

18. The display device as claimed in claim 17, wherein the shading electrode connection line at least partially overlaps with the semiconductor layer.

19. The display device as claimed in claim 17, wherein the shading electrode connection line also comprises a straight portion connecting to the mesh pattern via a connecting point, and the connecting point is not overlapped with the semiconductor layer.

20. The display device as claimed in claim 17, wherein the pixel structure further comprises a second TFT, and the shading electrode connection line further comprises a polyline pattern, the shading electrode connection line bypasses a semiconductor layer of the second TFT via the polyline pattern;

wherein the pixel structure further comprises a third TFT, and the shading electrode connection line bypasses a semiconductor layer of the third TFT via the polyline pattern; and wherein the first TFT is a shared TFT, the second TFT is configured as a main-area TFT, and the third TFT is configured as a sub-area TFT.

\* \* \* \* \*